(12) United States Patent
Luk et al.

(10) Patent No.: US 6,982,897 B2
(45) Date of Patent: Jan. 3, 2006

(54) NONDESTRUCTIVE READ, TWO-SWITCH, SINGLE-CHARGE-STORAGE DEVICE RAM DEVICES

(75) Inventors: Wing K. Luk, Chappaqua, NY (US); Robert H. Dennard, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 151 days.

(21) Appl. No.: 10/680,348

(22) Filed: Oct. 7, 2003

(65) Prior Publication Data

US 2005/0073871 A1    Apr. 7, 2005

(51) Int. Cl.
  *G11C 11/24*  (2006.01)
(52) U.S. Cl. ................................ 365/149; 365/187
(58) Field of Classification Search ............ 365/149, 365/187, 145; 257/296, 300
  See application file for complete search history.

(56) References Cited

U.S. PATENT DOCUMENTS

| | | | |
|---|---|---|---|
| 3,387,286 A | | 6/1968 | Dennard |
| 5,122,986 A | * | 6/1992 | Lim ...................... 365/189.11 |
| 5,377,142 A | * | 12/1994 | Matsumura et al. ... 365/189.01 |
| 5,652,728 A | * | 7/1997 | Hosotani et al. ............ 365/210 |
| 5,909,400 A | * | 6/1999 | Bertin et al. ................. 365/187 |
| 5,936,881 A | * | 8/1999 | Kawashima et al. ........ 365/149 |
| 6,016,268 A | * | 1/2000 | Worley ........................ 365/149 |
| 6,317,365 B1 | * | 11/2001 | Tanaka ........................ 365/187 |
| 6,751,142 B2 | * | 6/2004 | Hanzawa et al. ........... 365/210 |
| 6,787,835 B2 | * | 9/2004 | Atwood et al. .............. 257/296 |
| 6,862,205 B2 | * | 3/2005 | Agata et al. ................. 365/149 |

OTHER PUBLICATIONS

Karp et al., "A 4096-Bit Dynamica MOS RAM," ISSCC 72, pp. 10-11, (1972).

* cited by examiner

*Primary Examiner*—Son Mai
(74) *Attorney, Agent, or Firm*—Ryan, Mason & Lewis, LLP; Casey P. August, Esq.

(57) ABSTRACT

A random access memory (RAM) circuit is coupled to a write control line, a read control line, and one or more bitlines, and includes a write switch having a control terminal and first and second terminals. The first terminal of the write switch is coupled to the one or more bitlines, and the control terminal of the write switch is coupled to the write control line. The circuit includes a charge-storage device having first and second terminals, wherein a first terminal of the charge-storage device is coupled to the second terminal of the write switch and a second terminal of the charge-storage device is coupled to the read control line. The circuit includes a read switch having a control terminal and first and second terminals. The control terminal of the read switch is coupled to the first terminal of the charge-storage device and is coupled to the second terminal of the write switch. The first terminal of the read switch is coupled to the one or more bitlines, and the second terminal of the read switch coupled to ground. The circuit may be implemented through a number of disclosed semiconductor memory devices.

18 Claims, 10 Drawing Sheets

FIG. 6

| DOUBLE GATE | VBLH | VWLw | VTw | VWLr | VTr | Vsrc | Vcell STORE, READ | VBL | Vg_leak_read Vcellmax − (Vsrc + Vt) |
|---|---|---|---|---|---|---|---|---|---|
| p+, n+ | 0.8 | −0.5 ~0.8 | 0.5 | −0.8 ~0 ~0.8 | 1.2 | 0 | 0 ~0.8, 0.6 ~1.4 | 0 ~0.8 | 0.8 − (0+1.2) = −0.4 |
| w, n+ | 0.5 | −0.5 ~0.8 | 0.5 | −0.5 ~0 ~0.8 | 0.8 | 0 | 0 ~0.7, 0.6 ~1.3 | 0 ~0.5 | 0.7 − (0+0.8) = −0.1 |
| w, n+ | 0.5 | −0.5 ~1.0 | 0.5 | 0 ~1.0 | 0.8 | 0 | 0 ~0.4, 0.7 ~1.1 | 0 ~0.5 | 0.4 − (0+0.8) = −0.4 |
| p+, n+ | 0.5 | −0.5 ~1.0 | 0.5 | 0 ~1.0 | 1.2 | −0.5 | 0 ~0.4, 0.7 ~1.1 | −0.x ~0.5 | 0.4 − (−0.5+1.2) = −0.3 |
| p+, n+ | 1.0 | 0 ~1.5 | 0.5 | 0 ~1.0 | 1.2 | 0 | 0.5 ~0.9, 1.2 ~1.6 | 0.x ~1.0 | 0.9 − (0+1.2) = −0.3 |
| p+, n+ | 0.4 | 0 ~1.0 | 0.5 | 0 ~1.0 | 0.6 | 0 | 0 ~0.4, 0.7 ~1.1 | 0 ~0.4 | 0.4 − (0+0.6) = −0.2 |

FIG. 8

| | TRADITIONAL 1T1C CELL | NDR 2T1C CELL | NDR 2T1C CELL (WITH WRITE BOOST) |
|---|---|---|---|
| BLWrite | VBLH | VBLH | VBLH |
| Vcell_i(0,1) | 0, VBLH | 0, VBLH | 0, VBLH + VB |
| Vcell_f(0,1) | 0, VBLH Tr (<VBLH)<br>Tr = Ccell/(Ccell+Cbl) | bVread, VBLH + bVread<br>b = Ccell/(Ccell+Crg) | bVread, VBLH + VB + bVread<br>b = Ccell/(Ccell+Crg) |
| GAIN =<br>(Vcell_f(0,1)/Vcell_i(0,1)) | Ccell/(Ccell + Cbl)<br><<1, TYPICALLY 0.2 | 1 | 1<br>GAIN (OVER VBLH) = 1 + VB/VBLH ~2 |

US 6,982,897 B2

NONDESTRUCTIVE READ, TWO-SWITCH, SINGLE-CHARGE-STORAGE DEVICE RAM DEVICES

FIELD OF THE INVENTION

The present invention relates to random access memory (RAM) and, more particularly, relates to RAM devices having nondestructive reads.

BACKGROUND OF THE INVENTION

Cells in conventional dynamic random access memory (DRAM) devices employ a charge storage element, which is generally a storage capacitor. Cells in conventional DRAM have to be periodically refreshed, as the storage capacitor loses charge over time. Additionally, traditional read operations based on charge sharing between a DRAM cell and a bitline cause the charge stored on the storage capacitor in the DRAM cell to be lost. This means that a read operation on a conventional DRAM cell will require reading a value from the cell and then writing the value back to the cell. This is called a "write back" operation.

There are more recent DRAM implementations that do not need the write back operation, but these implementations have additional problems, such as requiring larger silicon area.

Thus, there is a need to provide improved devices for DRAM cells.

SUMMARY OF THE INVENTION

Exemplary aspects of the present invention provide nondestructive read, two-transistor, one-capacitor dynamic random access memory (DRAM) devices.

In an exemplary aspect of the invention, a RAM circuit is coupled to a write control line, a read control line, and one or more bitlines. The RAM circuit includes a write switch having a control terminal and first and second terminals. The first terminal of the write switch is coupled to the one or more bitlines, and the control terminal of the write switch is coupled to the write control line. The RAM circuit further includes a charge-storage device having first and second terminals, wherein a first terminal of the charge-storage device is coupled to the second terminal of the write switch and a second terminal of the charge-storage device is coupled to the read control line. The RAM circuit additionally includes a read switch having a control terminal and first and second terminals. The control terminal of the read switch is coupled to the first terminal of the charge-storage device and is coupled to the second terminal of the write switch. The first terminal of the read switch is coupled to the one or more bitlines, and the second terminal of the read switch coupled to ground.

The one or more bitlines may be a single bitline, which creates a single-port RAM circuit. Additionally, the one or more bitlines may be two bitlines, so that a dual-port memory circuit is created. One bitline is a write bitline coupled to the write switch, while another bitline is a read bitline coupled to the first terminal of the read switch. Furthermore, the one or more bitlines may be three or more bitlines, so that a memory circuit with more than one write port or more than one read port or both can be formed.

In another exemplary aspect of the invention, a semiconductor memory device is disclosed. The semiconductor memory device has a read transistor having first and second source/drain areas formed on sides of a first diffusion area, a gate formed above the first diffusion area, and a gate insulator positioned between the gate and the first diffusion area. The semiconductor memory device additionally has a conductive layer, the conductive layer and the gate of the read transistor partially overlapping. There is an insulator formed between the gate of the read transistor and the conductive layer, where the conductive layer, gate of the read transistor, and insulator form a charge-storage device.

A write transistor has first and second source/drain areas formed on sides of a second diffusion area, a gate formed above the second diffusion area, and a gate insulator positioned between the gate and the second diffusion area. Additionally, the semiconductor memory device has a coupling device that couples the first source/drain area of the write transistor to the charge storage device.

Write boosting may be used to boost the voltage stored by the storage capacitor of the previously described semiconductor memory device to a voltage higher than the bitline supply voltage (e.g., VBLH) for data one. Higher cell stored voltage is desirable for longer data retention and higher signal to noise margin.

Furthermore, another semiconductor memory device is disclosed that has a read transistor having first and second source/drain areas formed on sides of a first diffusion area, a gate formed above the first diffusion area, and a gate insulator positioned between the gate and the first diffusion area. This semiconductor memory device has a write transistor comprising first and second source/drain areas formed on sides of a second diffusion area, a gate formed above the second diffusion area, and a gate insulator positioned between the gate and the second diffusion area. Additionally, the semiconductor memory device has a conductive layer, the conductive layer and the channel region of the read transistor at least partially overlapping. An insulator is formed between the first diffusion area and conductive layer, the insulator abutting a bottom of the first diffusion area and abutting a surface of the conductive layer. A coupling device is also part of the semiconductor memory device, the couple device coupling the first source/drain area of the write transistor to the conductive layer.

When charge is written to the conductive layer, the charge affects the threshold voltage of the read gate. When a read is performed on the semiconductor memory device, the read gate will conduct current, the conduction depending on the charge on the conductive layer.

A more complete understanding of the present invention, as well as further features and advantages of the present invention, will be obtained by reference to the following detailed description and drawings.

BRIEF DESCRIPTION OF THE DRAWINGS

FIG. 6 is a table illustrating possible voltages for certain exemplary types of random access memory devices made in accordance with embodiments of the present invention;

FIG. 8 is a table used to compare RAM cells of the present invention with a traditional RAM cell.

DETAILED DESCRIPTION OF PREFERRED EMBODIMENTS

Figure 1:
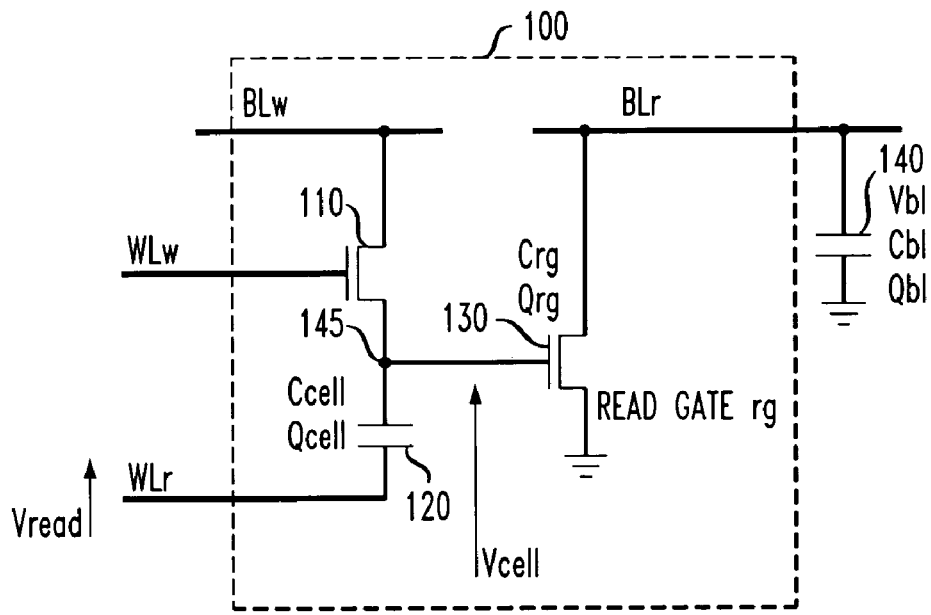
FIG. 1 shows a random access memory circuit coupled to two bitlines.

The original DRAM cell is a compact implementation, in that it takes relatively little surface area, as the storage capacitor can be formed beneath devices used to read and write the DRAM cell. Consequently, many DRAM cells can be made to fit on a small surface area on a semiconductor. The original DRAM implementation, while relatively space efficient, does, however, need a relatively large storage capacitor. There is an effect in the original DRAM implementation called "charge sharing." The bitline to which the charge from the storage capacitor is coupled has a relatively large capacitance. The charge from the storage capacitor goes toward charging the capacitance in the bitline. So, the storage capacitor has to have a relatively large capacitance in order to store enough charge to charge the capacitance in the bitline and provide enough additional charge for a sense amplifier to determine a value stored in the storage capacitor. Thus, because the capacitance in the bitline is relatively large, the storage capacitor also has to be relatively large. Storage capacitors for DRAM cells based on the original DRAM implementation have a capacitance of about 30 femtofarads (fF), typically around one-quarter to one-fifth of the bitline capacitance.

Non-destructive read implementations eliminate the write back operation of the traditional DRAM. As a result, these implementations reduce read cycle time into roughly half compared to traditional DRAM, and hence greatly improves data throughput and memory bandwidth. The non-destructive memory cells presented herein achieve small area through a circuit that uses two transistors and one capacitor (referred to as "2T1C"), for both read and write, compared with the traditional three transistors, one capacitor (referred to as "3T1C") non-destructive read memory cell. The capacitor is structured to provide both data (charge) storage and row address selection. In the traditional 3T1C memory cell, the charge storage and row address selection would require two devices, namely one transistor and one capacitor. The memory cells presented herein reduce the device count by one as compared to the 3T1C memory cells.

A benefit to the 2T1C DRAM cell designs presented herein is that they allow for smaller storage capacitors, smaller device count and area, compared to other traditional nondestructive read cells.

Further, in exemplary aspects of the present invention, the read device, whose gate connects to and "reads" the stored charge via a cell storage node, and the storage capacitor in this 2T1C structure may be specially devised and stacked together by choosing suitable combinations of doping, dielectric thickness, and gate material, to achieve the desired transistor threshold, working conditions such as small leakage and long retention time, and small total cell area. For example, the threshold voltage of the read device may be devised such that the high, or "data one," voltage stored in the memory cells, in the worst case scenario, the cumulative effect from all the inactive read devices (e.g., in all the unaccessed rows) of a bitline would not discharge the bitline due to subthreshold leakage current through the inactive read devices. Discharging the bitline would potentially cause a false one. That is, the "ON current" of the read device is much larger than the total subthreshold "OFF current" of the read device multiplied by the number of cells connected to a bitline.

A storage capacitor of memory devices in accordance with exemplary aspects of the present invention can be made much smaller in capacitance than that used in the original DRAM implementation, due to the non-charge-sharing nature of read operations (on the order of 1 fF in exemplary aspects of the present invention, compared to 30 fF in current state-of-the-art DRAM cells). Other exemplary advantages of the present invention include smaller surface area and less devices than the non-destructive 3T1C DRAM implementations. More advantages are described below.

Exemplary aspects of the present invention provide RAM devices, suitable for DRAM, based on two switches and a charge-storage device. The RAM devices can be, in an exemplary aspect of the invention, referred to as "NDR 2T1C," because the RAM devices can include nondestructive read, two transistor, one capacitor devices. Turning now to FIG. 1 an exemplary RAM device, RAM circuit 100, is shown coupled to separate bitlines for reading (BLr) and writing (BLw). Another exemplary RAM device, a single port memory cell, can be formed by merging the two distinct read and write bitlines into a single bitline to share between read and write operations.

One field effect transistor (FET) is write transistor 110, another FET is read transistor 130 and the capacitor 120 stores electric charges corresponding to data having values of zero or one. Although only a capacitor 120 is described herein, the capacitor 120 can be any device suitable for storing a charge. Read transistor 130 is shown as "ReadGate rg," with capacitance "Crg" and with charge of "Qrg." The capacitor 120 has a capacitance of "Ccell" and a charge of "Qcell." The memory circuit 100 can be used as one cell of a RAM. Consequently, the memory circuit 100 will also be referred to as a memory cell 100. The write transistor 110 and read transistor 130 will generally be FET transistors, but other transistors may be used, depending on implementation.

The read transistor 130 and write transistor 110 operate like switches, and they have a control line and two terminals. For FETs, the control line is a gate terminal, and the two terminals are source/drain terminals, as a FET is a bi-directional device.

In the example of FIG. 1, there are four signal lines to each memory cell: the write bitline, BLw; the read bitline BLr; the write control line, WLw; and the read control line, WLr. This memory cell 100 is a dual-port RAM circuit, which allows one cell to be read from while another cell (not shown) is written into. In this case, one set of cells are addressed and controlled by a wordline WLr for read operation, and another set of cells are addressed and controlled by another wordline WLw for write operation. The bitlines BLw and BLr can be combined, if desired, into one bitline, BL. The BL can serve as the combined input and output line to the memory cell 100, forming a single-port memory cell. The read bitline BLr has a capacitance of "Cbl" and a charge of "Qbl."

When creating an array (not shown) of cells, each cell will include one memory cell 100. As is known in the art, a plurality of N memory cells can be connected to one bitline (e.g., for single port RAM) or multiple bitlines (e.g., for multiport RAM) running vertically (for instance), and the write control line (WLw) and read control line (WLr), running horizontally, will connect to a corresponding M memory cells to form an array of M×N memory cells. For each bitline, there is a sense amplifier. A row of sense amplifiers are located at the top or the bottom of the array. The functions of each sense amplifier are the following: initializing the bitline (precharge operation); detecting the bitline signal developed by the stored charge of a cell activated by a WLr for read operation as zero or one; and writing to a cell activated by a WLw via the bitline for write operations.

Additionally, a plurality of memory arrays can be stacked on top of each other to form a macro. Each bitline may then be connected to a sense amplifier (not shown) at the bottom of the array for signal amplification and further transferred via global data-line (or global bitline) to the global sense amplifier at the bottom of the macro for output. Data input is written from the global sense amplifier via the global data-line to the individual array selected, then via the bitline to the selected cell.

The RAM circuit shown in FIG. 1 can be implemented in a number of ways, as shown, for instance, in FIGS. 3A, 3B, 4A, and 4B.

Figure 2:
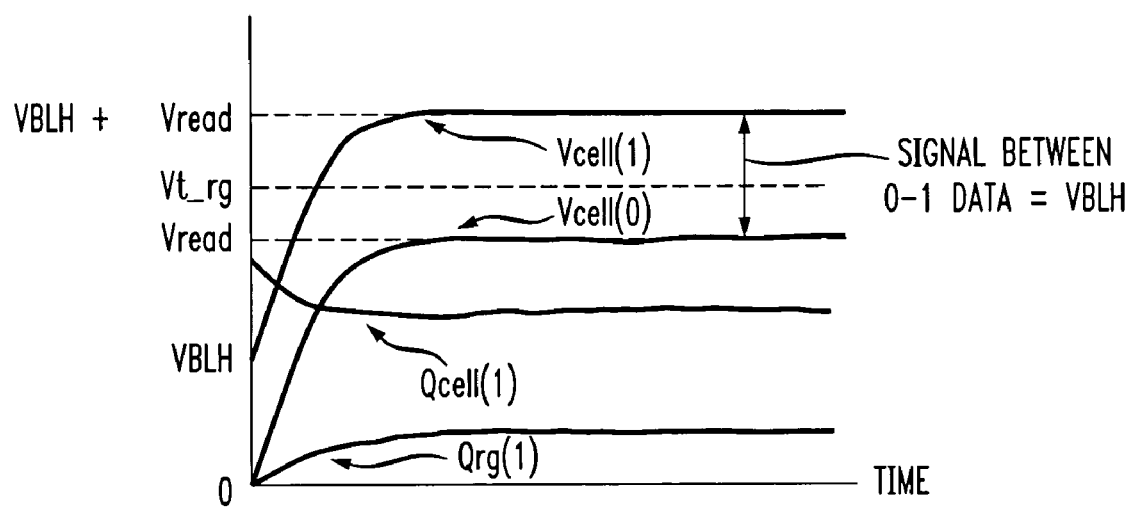
FIG. 2 shows a graph of voltage and time for the random access memory (RAM) circuit of FIG. 1.

In FIG. 2, a graph is shown for the memory cell 100 during a read operation. In the following example, there is one bitline (BL). It is beneficial to also review FIG. 1 during the following description. A read operation with the circuit of FIG. 1 is generally a nondestructive read boosting operation. When the read control line, WLr, is activated high by a certain amount denoted by "Vread," the other end (i.e., location 145) of the capacitor 120 will have a voltage boost (VB) about the same amount. This is called "read boosting" herein. In more detail, for stray capacitance, which is typically caused by the gate and source/drain capacitance of the connecting devices, totaling "Cs" at storage node (location 145), the voltage boost would be reduced by an amount equal to $Cs/(Cs+Ccell)$. Typically, Cs is small compared to Ccell, a ratio of about 1/10 for instance, so the ratio $Cs/(Cs+Ccell)$ is small. Therefore, the voltage boost is close to the amount Vread.

The write transistor 110 is used to apply the cell voltage, Vcell, to location 145. Before the read operation, the BL is precharged to high, in an exemplary scheme called BL-High sensing or VBLH sensing.

Another exemplary of the current memory cell is a complementary version, namely, the read device rg is replaced with its complementary counterpart, a PFET with source connected to VBLH instead of ground. Complementary counterpart means NFET replaced with PFET, and vice versa, voltage with complementary voltage. Further, ground sensing in which the bitline is precharged to ground (e.g., 0 volts) is used. When the cell stores a one and is read, the bitline stays at ground; when the cell stores a zero and is read, the bitline voltage rises to high charged via the read device (e.g., a PFET).

The voltage boost, Vread, plus the storage voltage in the memory cell (VCell) appears at the gate of the read transistor 130. If a data one has been stored in the memory cell with a voltage Vcell(1), then the voltage boost and the voltage in the memory cell will be, in this example, greater than the threshold voltage of the read transistor 130, $Vread+Vcell(1) > Vt\_rg$. In this situation, the read transistor 130 is turned on strongly and hence discharges the BL. This is called a "read 1" operation. The charge, Qcell(1), on the capacitor 120 will transfer a small amount of charge (e.g., Qrg(1)) to the gate of the read transistor 130. At the end of the read operation when the read control line returns to zero, that amount of charge will return to the storage capacitor 120. If a data zero has been stored, then the sum of the voltage boost and the voltage Vcell(0) in the memory cell will be, in this example, less than the threshold voltage of the read transistor 130 ($Vread+VCell(0)<Vt\_rg$). In this situation, the read transistor 130 is not turned on (or is turned on very minimally) and the BL remains high, or relatively high as compared to the "read 1" operation. This operation is called the "read 0" operation.

In the example of FIG. 2, at the steady state of a read operation, the Vcell(0) is equal to Vread, which means that no voltage (or charge) is stored at location 145. However, there can be a voltage (or a certain charge) stored at location 145 so that Vcell(0) is not equal to Vread, as the examples shown below point out.

In order to adjust the threshold voltage of the read transistor 130 so that the threshold voltage lies between (VBLH+Vread) and Vread, the threshold voltage of the read transistor 130 is devised to be higher than normal for metal oxide semiconductor (MOS) FETs (MOSFETs). For example, a normal MOSFET might have a threshold voltage of 0.2 to 0.3 volts (V), while it can be beneficial in the circuit of FIG. 1 to use a read transistor 130 with a threshold voltage of about 1.2 V, for example. Such read transistors 130 can be designed, for example, by doping a gate of the read transistor 130 in the appropriate manner, specifically with p+ to raise the transistor threshold of the read transistor to a high level as described, contrasted to the threshold voltage in typical transistors. Additionally structures of suitable read transistors 130 can be devised using different gate material, doping, gate thickness, and dielectric properties, and examples of suitable structures are described below.

A write boosting operation may be described as follows. The read control line, WLr, is normally at zero voltage or grounded. When the write control line, WLw, is activated high, it enables the write transistor 110, and a zero or one is written from the BL (e.g., BLw in FIG. 1) into the memory circuit 100 in which the data is stored. Write boosting can be applied as an option to increase the voltage stored for a data value of one (a "write 1" voltage), or reduce the maximum voltage for WL boosting for the word control line WLw, which otherwise would have to be higher, to overcome the threshold voltage of the write transistor 110, in order to write a high voltage for a data value of one. During a write operation, right after the write transistor 110 is turned on, the signal on the read control line, WLr, is dropped negatively by a certain amount (e.g., –VB) and that voltage is held for a predetermined time during the write operation. Before the end of the write operation, the signal on the read control line, WLr, is returned to zero (for instance).

When the signal on the read control line, WLr, returns from –VB to zero, the cell "write 1" voltage will be boosted by an amount determined by VB. Such boosted "write 1" voltage on the cell would not disturb the write bitline, BLw, even the write control line may still be on, as the write transistor 110 is reversely biased due to the boosted "write 1" cell voltage at the source being higher than the gate voltage plus the threshold voltage of the write transistor 110. In other words, the cell voltage 145 will be, when writing a one and after the write boosting from –VB to zero (for example), high enough so that the write transistor 110 is basically turned off (e.g., is cutoff). It should be noted that the cell voltage 145 will be increased ideally by VB in this example, but in general, the actual amount of increase will be less than VB due to capacitive and other losses.

When zero is being written into the cell, the signal on the read control line, WLr, drops to –VB and return to zero has little effect on the writing of a zero or "write 0" voltage, since the write transistor 110 has enough gate overdrive (e.g., Vgate−Vt) to maintain the on state and the bitline with higher capacitance at zero voltage will hold the cell voltage (Vcell) 145 at zero voltage ("write 0" voltage). In other words, when writing a zero, the write transistor 110 will basically be turned on because the voltage on the bitline remains low. The write boosting is mainly used to improve the writing of a one when the cell was storing a zero, since writing zero and writing one when the cell is at one are relatively easy compared to writing a one when the cell is at zero.

To write to the storage cell effectively without applying a large boosting voltage on the gate of the write transistor 110, a boosting technique called "one-way" boosting is applied. In traditional DRAM, a large boosting voltage is applied to the write control gates in order to write a full voltage to the storage cell, but this approach has the drawback of requiring complex wordline drivers and putting too much stress on the write transistors. The "one-way" boosting circuit and method is described as follows.

In the one-way write boosting, the predetermined precharge voltage (e.g., VBLH) on the bitline BLw can be smaller than the stored data one voltage set forth by, e.g., a retention time, a noise margin requirement, or both. The write boosting can boost the cell stored voltage (e.g., Vcell 145) to higher than the bitline predetermined high voltage.

The write control line WLw voltage to the write switch 110 can be between 0 V and a predetermined bitline BLw voltage plus a constant. When the write switch 110 is a transistor, the constant is the threshold voltage of the write transistor 110. For example, if the bitline high voltage is VBLH, and the nominal threshold voltage of the write transistor is Vt, then the write control line WLw predetermined high voltage would be VBLH+Vt. Also the 0 V of the predetermined write control voltage can be replaced by a negative voltage to enhance the off state of the write switch to improve storage cell retention.

A specific predetermined voltage is applied to the read control line WLr during a write operation. The initial predetermined voltage on the read control line WLr is low (e.g., some negative voltage), and is raised to high (e.g., 0 V) during the write operation. An alternative voltage scheme is to raise the read control line from 0 V to a certain positive voltage. The key, when the write switch 110 is an NFET transistor, is a voltage increase during a write operation. Firstly, the raising of the read control line WLr from a lower voltage (e.g., the negative predetermined voltage) to a higher voltage (e.g., ground) is key to the boosting of the data one voltage, as well as turning-off the write switch 110. Secondly, such raising of the read control line WLr voltage does not boost the data zero voltage as the write switch 110 is not turned off, hence keeping the storage cell voltage at the low voltage of the bitline predetermined voltage (for data zero). So if the predetermined bitline high voltage is denoted by VBLH, and low voltage is 0 V, the bitline voltage difference between data zero and data one is VBLH. For writing data one, if the boosting voltage jump on the read control line is VB, a voltage of VBLH+VB will be written to the storage cell at the end of the write operation. For writing data zero, since the boosting is only one-way, and the cell storage voltage Vcell 145 stays around 0 V. As a result, the voltage difference, corresponding to data one and data zero, stored in the storage cell is VBLH+VB, resulting a gain of (VBLH+VB)/VBLH=1+VB/VBLH, which is strictly larger than 1. Typically the gain is close to 2, taking into account stray capacitance around the memory circuit, as VB is about the same as VBLH. It is desirable that a smaller voltage differential on the bitline BLw between data one and data zero is amplified and stored in the storage cell as a larger voltage differential, by means of the "one-way" boosting of the read control line WLr, regardless of the write control voltage.

An example operation with read boosting and write boosting is as follows:
VBLH=0.5 V
Vcell(0)=0→0.6 V (e.g., read boost=0.6 V)
Vcell(1)=0.7 V→1.3 V (e.g., read boost=0.6 V)
Vt_rg=0.8 V, Vt_w=0.5 V
V_WLw=−0.5–1.0 V
V_WLr=−0.5 V–0–1.0 V (WLr switching between three voltage levels)

An exemplary operation using only read boosting is shown as follows.
VBLH=0.5 V
Vcell(0)=0→0.5 V (e.g., read boost=0.5 V)
Vcell(1)=0.5 V→1.0 V (e.g., read boost=0.5 V)
Vt_rg=0.5 V
V_WLw=1.0 V
V_WLr=0–1.0 V (WLr switching between two voltage levels)

The stored charge (representing values zero or one) in the NDR 2T1C cell (e.g., RAM circuit 100) remains unchanged after a read operation. The cell voltage corresponding to zero or one appears at the gate of the read transistor 130. During a read operation, the read transistor 130 is generally turned on for reading a one, or generally remains off (or very slightly on) for reading a zero. Turning on or off the read transistor 130 subsequently gives rise to a large source-drain current in the read transistor 130 for reading a one and a large swing in the BL voltage (e.g., BLr in FIG. 1) for sensing. In general, there is no charge sharing during the read operation. Since a write back operation is not required after a read operation, the theoretical cycle time for this memory cell 100 is about half that of a conventional DRAM cell, assuming other conditions being equal. Further, the speed of the write transistor 110 and read transistor 130 are faster than the transfer gate and trench storage capacitor of a conventional DRAM cell combined, due to inherently large resistance-capacitance (RC) constant in the transfer gate and storage capacitor.

The non-destructive read (NDR) 2T1C memory cell can function at a voltage that is much smaller than that of DRAM at for a given technology and has much better sensing voltage margin, e.g., 0.4V bitline voltage compared to 1.0V for conventional DRAM. This is because the stored cell voltage is directly boosted up during read to drive the read transistor 130 for sensing, and further the stored cell voltage is directly applied to the gate of the read transistor 130 for sensing. This can be explained as follows and is illustrated by the table shown in FIG. 8, by comparing voltage gain of the two memory cells. For example, in a convention DRAM cell with transfer ratio of 1/4 (transfer ratio is cell capacitance divided by bitline capacitance), for a given BL voltage, one would only get about 20 percent of that sensing signal voltage in DRAM charge transfer type of operation. In other words, the gain of a conventional DRAM cell with transfer ratio of 1/4 is 0.2, or in general the gain is 1/(1+1/transfer_ratio). As illustrated by the table shown in FIG. 8, for a nondestructive read (NDR) 2T1C memory cell, the initial voltage difference betweeen a "read 0" and a "read 1" is VBLH, and the final voltage difference between a "read 0" and a "read 1" is VBLH, so the gain is 1. Hence the gain for the nondestructive memory cell is few times that for a conventional DRAM cell, resulting in much better signal margin between the two stored states of zero and one. In the following table, Vcell_f(0,1) is the final cell voltage for a particular state (e.g., either zero or one), and Vcell_i(0,1) is the initial cell voltage for the particular state (e.g., either zero or one).

With the described write boosting and read boosting operations and low bitline voltage, the wordline voltage (WLw) for the write devices can be much lower too without using the traditional word-line boosting to simplify wordline driver design and reduce power. Thus, due to the small bitline voltage and better storage cell signal margin as described earlier, the operating voltage of the NDR 2T1C memory can approach half that of a traditional DRAM cell, resulting in lower power.

The storage capacitor of the memory cell can be created in various forms in different technologies using two layers of conductive material with oxide with a certain thickness and dielectric property in between. Oxide with higher than nominal dielectric coefficient may be used to create a capacitor with higher capacitance per unit area, hence resulting in further silicon area reduction for a given oxide thickness.

The gate and capacitor oxide thickness is preferably devised to satisfy certain minimum thickness requirements such that the gate leakage current (e.g., gate tunneling current) is under certain level, which is dictated by the cell retention time requirement. For the current technology level, typical oxide thickness is 25 Å (Angstrom).

Leakage at the storage node (Vcell) (e.g., the polysilicon layers 315 and 318 of FIG. 3A, described in detail below) is due to gate tunneling current in the read transistor and storage capacitor, and source-drain leakage and junction leakage current in the write transistor. To reduce tunneling current in storage node, sufficient oxide thickness should be provided for the gate (~25 Å). Write transistor leakage handling is similar to a conventional DRAM situation.

For example, retention time may be determined as follows:

storage node leakage+tunneling current=10 fA, where, retention_time=Ccell V_leak/I_leak=1 fF×0.1 V/10 fA=0.01 sec (estimate).

It should be noted that capacitors may also be formed by complete overlap of a conductive layer and the gate of the read transistor.

Figure 3A:
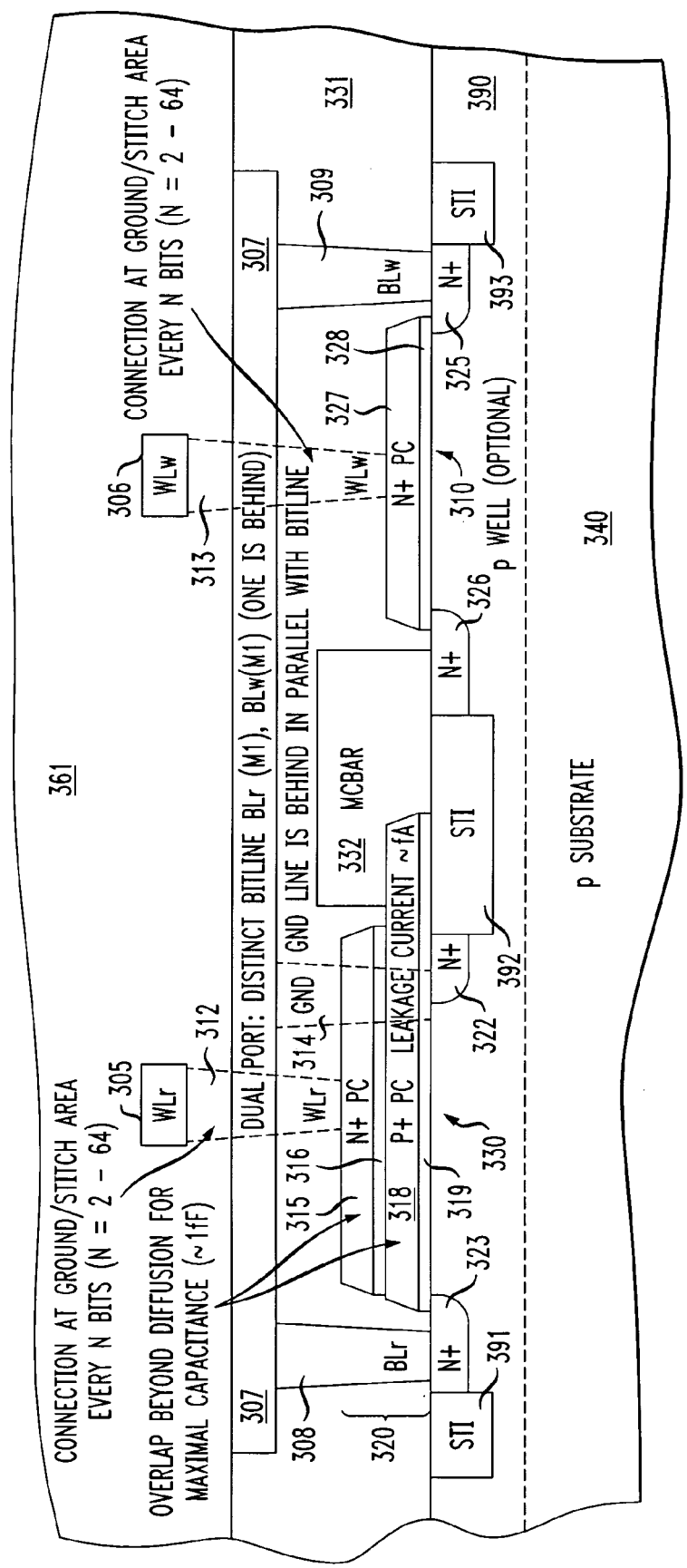
FIGS. 3A and 3B show cross-sections of exemplary memory devices having storage capacitors formed from n+ and p+ polysilicon areas and used to implement the random access memory circuit shown in FIG. 1.
Figure 3B:
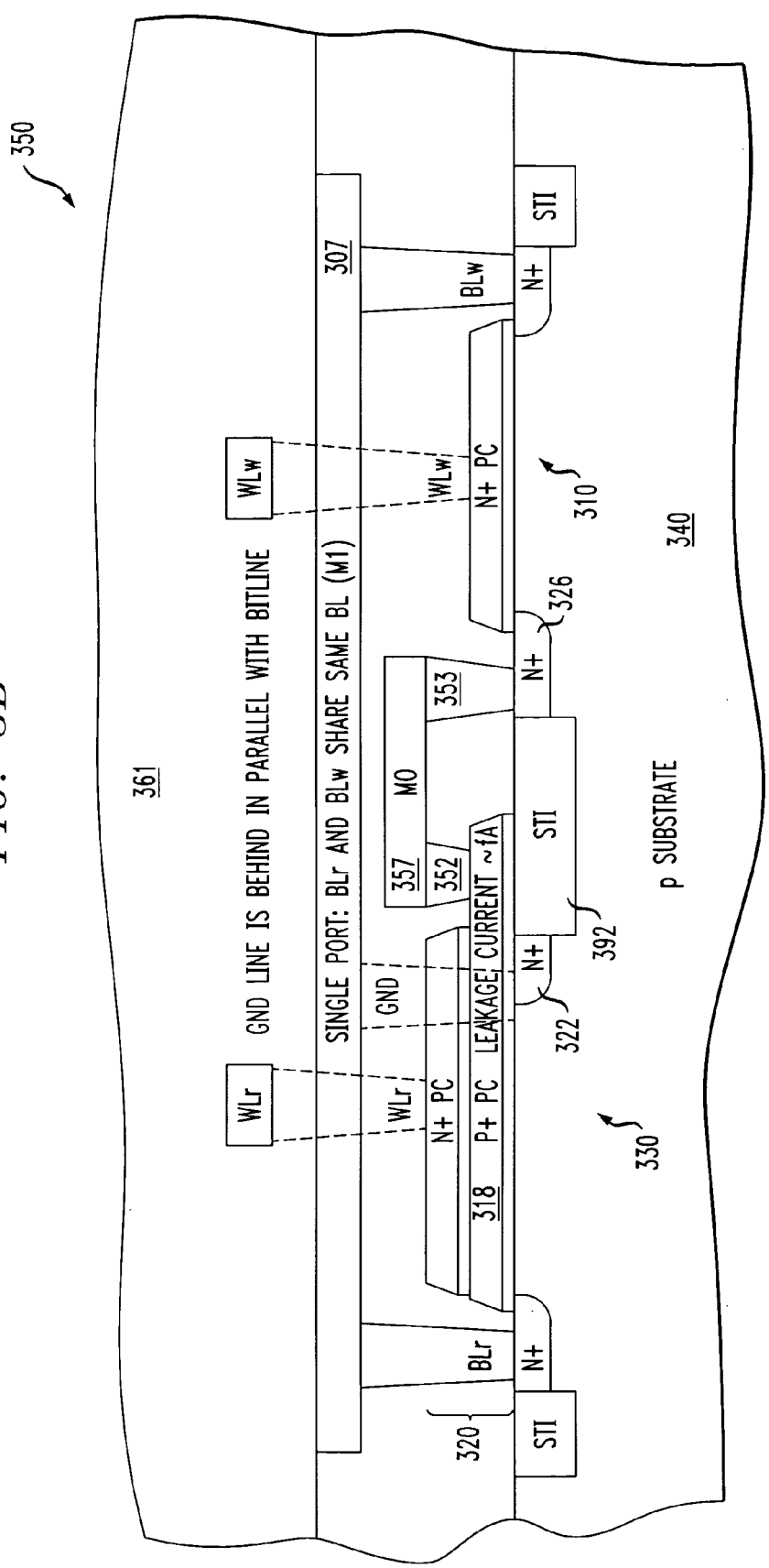

FIGS. 3A and 3B show cross-sections of a three-dimensional memory cell structures 300, 350 formed on a substrate 340 of a semiconductor. A read transistor 330 is formed on a p-well 390 and comprises source/drain regions 322 and 323, gate oxide 319, and p+ doped polysilicon gate 318. The p-well 390 is optional. A storage capacitor 320 is formed by overlapping two n+/p+ polysilicon layers 315, 318, respectively, with thin insulator 315 (e.g., oxide) in between. The p+ doped gate 318 raises the threshold voltage to a specific level as needed by the memory design requirement, as described earlier. The capacitor 320 is therefore formed by partially overlapping the n+ layer 315 on top of a read transistor 330, and is a charge-storage device. This overlapping further reduces silicon area used. The read transistor 330 has a threshold of about 1.2V in this example. The oxide 316 thickness between the two polysilicon layers 315, 318 should be larger than 25 angstroms in order to avoid excessive tunneling current. The bitlines 307 and source 314 of the read transistor 330 are running in the same direction (e.g., vertical) with first metal layer M1. The source 314 of the read transistor 330 is typically grounded.

A write transistor 310 is formed on p-well 390 and comprises source/drain regions 325 and 326, gate oxide 328, and n+ doped polysilicon gate 327. The write transistor 310 and read transistor 330 are separated by insulator 331. The write wordlines (WLw) 306 are running with second metal M2 on top of the write transistor 310 polysilicon gates 327 (orthogonally to M1 and formed in insulator 361) and are connected (e.g., through connection 313) to the write transistors 310 polysilicon gates 327 once every so many (e.g., 32 or 64) transistor 310 in the "stitch" area. Similarly, the "boost" (WLr) wordlines 305 are running with second metal M2 on top of the capacitor 320 n+ polysilicon layers 315 and are connected (through connection 312) to the capacitor 315 once every so many (e.g., 32 or 64) capacitors 320 in the stitch area. The bitline 307 (shown as a bitline for a single port cell) is connected to the read transistor 330 through connection 308 and connected to the write transistor 310 through connection 309.

In FIG. 3A, the read transistor 330 and write transistor 310 are connected through a coupling device called MCBAR 332, which is a metal region formed in insulator 331. In FIG. 3B, the read transistor 330 and write transistor 310 are connected through a coupling device including metal level M0 357 and connections 352, 353.

A shallow trench isolation (STI) region 392 separates read transistor 330 from write transistor 310. Additional STI regions 391 and 393 separate read transistor 330 and write transistor 310, respectively, from other devices. STI regions 391–393 are made of some type of insulating material.

The nondestructive memory cell structure shown in FIGS. 3A, 3B, 4A and 4B are single-port cells with a common bitline for read and write. The bitlines and ground lines are running in parallel. For the two-port version of the memory, where there are two bitlines, one bitline for write and one bitline for read, for each column of cells, the bitline shown is the read bitline connecting to the drain of the read transistor 330 (through a contact). The second, distinct write bitline would be running in parallel with the read bitline and connecting to the drain of the write transistor 310 (through a contact). In the figure shown, the second bitline would be behind the first read bitline. For each column (or vertical) group of memory cell in an memory array, the read bitline, write bitline and ground line are running parallel across the array (vertically). The two wordlines, one for read and one for write, are running in parallel, with the same level of metal (e.g., M2) orthogonally to the bitlines in the memory array (horizontally). As shown in FIGS. 3A, 3B, 4A and 4B, the wordlines are running into the Figures.

It should further be pointed out that the interconnections above the silicon area using diffusion contact, polysilicon contact, metal contact between adjacent metal layers, MCBAR (e.g., low level contact between diffusion and polysilicon), low level, first level and second level metal layers (M0, M1 and M2, respectively) to form the memory cell are for exemplary illustration. There are various ways of interconnecting a memory cell, and various ways of interconnecting a plurality of cells into a memory array. FIGS. 3A and 3B are two exemplary structures using respectively a (e.g., low level) metal layer (M0) and a (e.g., low level) contact between diffusion and polysilicon (MCBAR), similarly for FIGS. 4A and 4B.

Figure 4A:
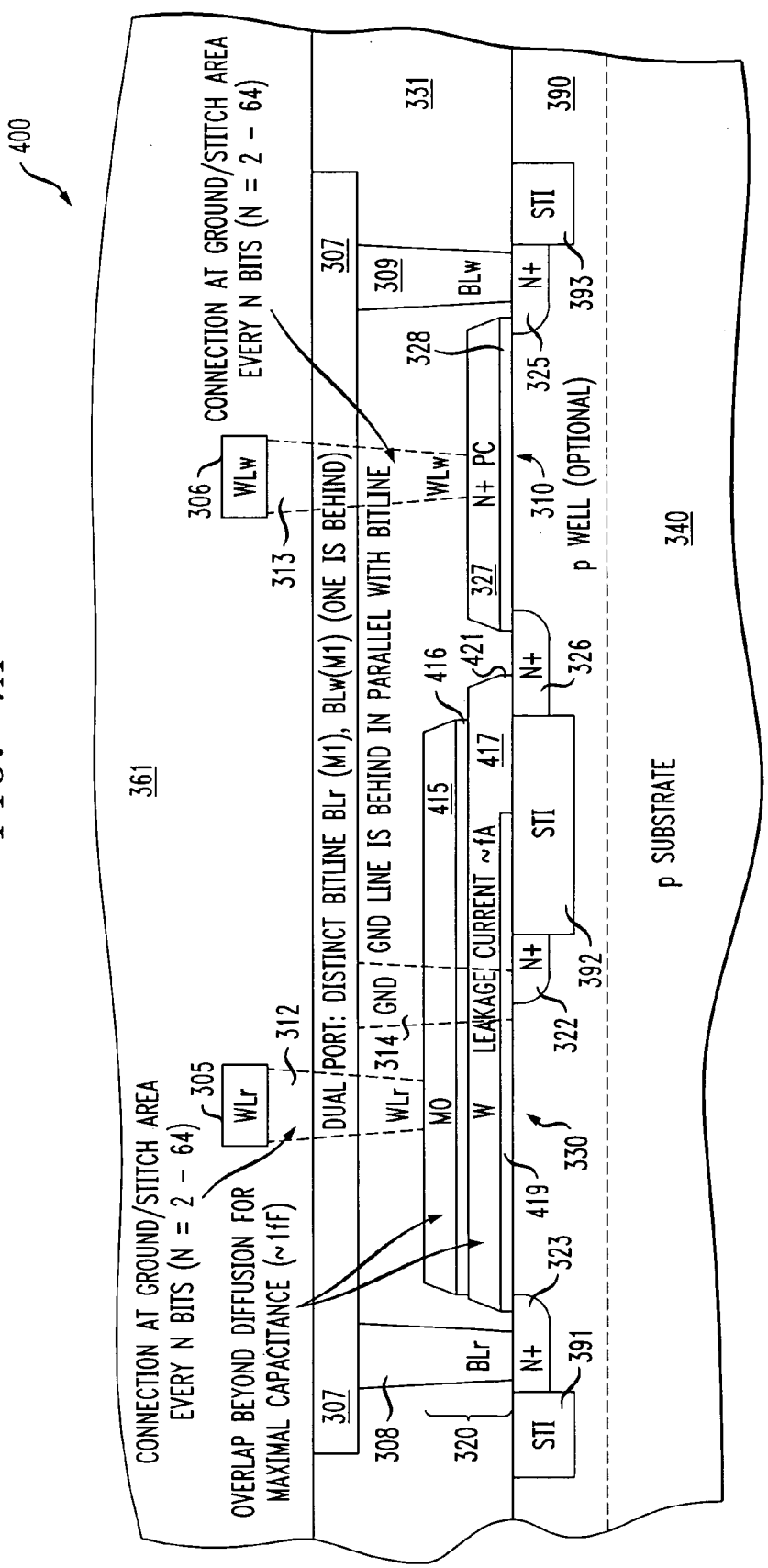
FIGS. 4A and 4B show cross-sections of exemplary memory devices having storage capacitors formed from metal and tungsten areas and used to implement the random access memory circuit shown in FIG. 1.
Figure 4B:
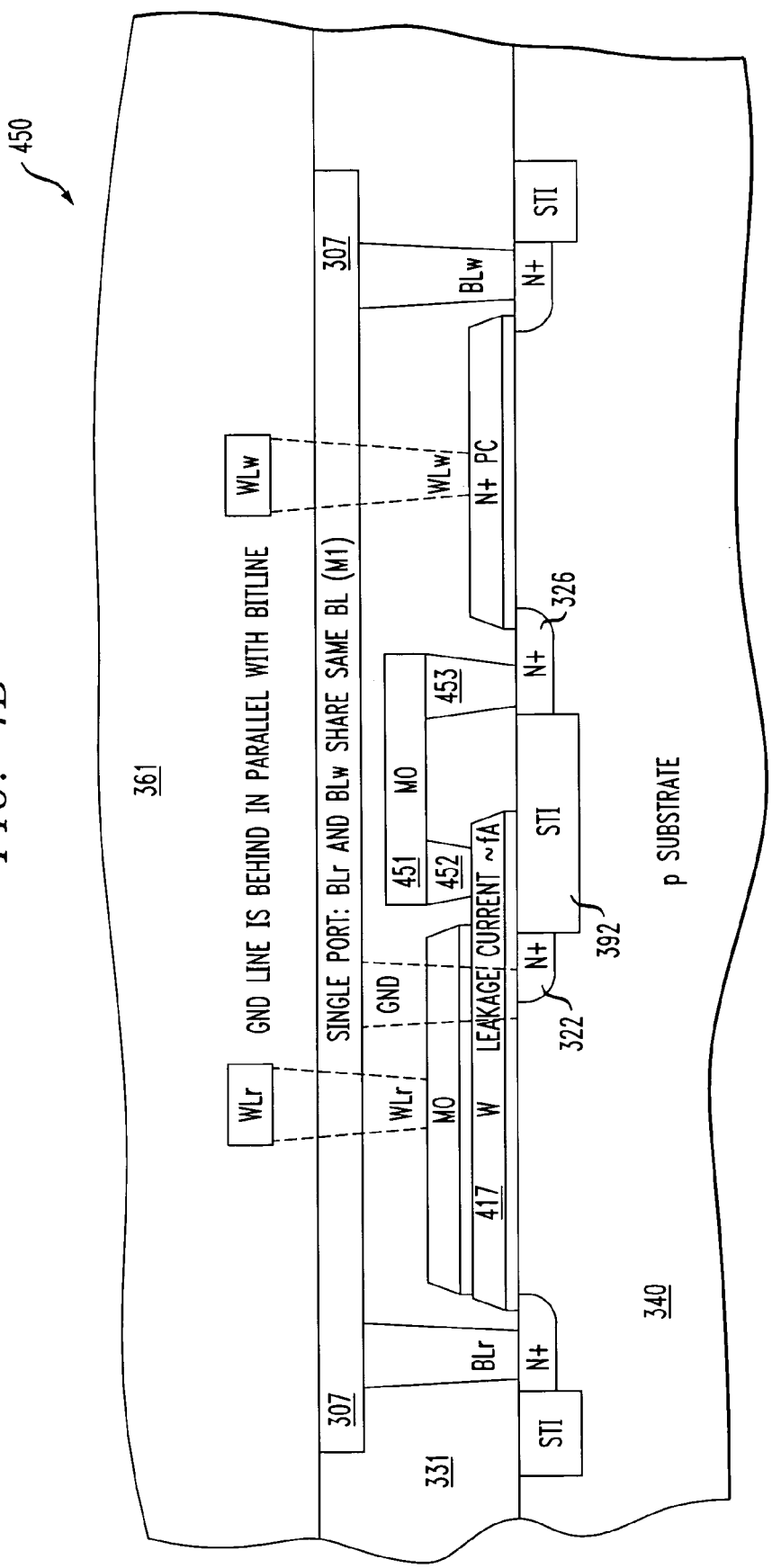

FIGS. 4A and 4B show cross-sections of a memory cell structures 400, 450 formed on a substrate 340 of a semiconductor. These memory cell structures are similar to the structures shown in FIGS. 3A and 3B, so emphasis is placed herein on describing differences between the structures 300, 350 and the structures 400, 450. In memory cell structures 400, 450, the storage capacitor 320 is formed by overlapping a metal layer 415 and a tungsten layer 417 with thin oxide 416 in between. The capacitor 320 is formed by partially overlapping the metal layer 415 on top of the read transistor 330. This further reduces silicon area. The read transistor 330 with the tungsten gate 417 has a threshold of about 0.8V in this example. The oxide 416 thickness between the metal layer 415 and tungsten layer 417 should be larger than 25 angstroms in order to avoid excessive tunneling current.

In FIG. 4A, the read transistor 330 and write transistor 310 are connected through a coupling device of a conductive portion 421, which is generally formed integrally with the tungsten layer 417. Tungsten layer 417 and conductive portion 421 overlie part of the source area 326. In FIG. 4B, the read transistor 330 and write transistor 310 are connected through a coupling device having the metal layer M0 451 and through connections 452 and 453. A gate oxide 454 underlies all of the tungsten layer 417 in FIG. 4B.

The table shown in FIG. 6 illustrates various exemplary configurations of transistors from FIGS. 3A, 3B, 4A, and 4B, with different voltages and technologies. In the table, VWLw is the voltage placed on the write control line (WLw), VTw is the threshold voltage of the write transistor, VWLr is the voltage placed on the read control line (WLr), VTr is the threshold voltage of the read transistor, Vsrc is the source voltage of the read transistor, Vcell is the voltage stored at location 145 of FIG. 1, VBLH is the bitline precharged voltage, VBL is the bitline voltage, and Vg_leak_read is a measure, at the gate of the read transistor, of its source-to-drain leakage current. Vg_leak_write, discussed below, is a measure, at the gate voltage of the write transistor, of its source-to-drain leakage current.

Typically, for word line voltage, VWLw=−0.5~1.0, cell voltage Vcell=0~0.4 V, the write transistor gate voltage, Vg_leak_write=VWLmin−(Vcellmin+Vt)= −0.5−(0+0.5)=−1.0. For word line voltage, VWLw=0~1.5, cell voltage Vcell=0.5~0.9 V, Vg_leak_write=0−(0.5+0.5) =−1.0.

From the table, Vg_leak_read=−0.2~−0.4 V, which is smaller compared to Vg_leak_write. Higher reverse gate voltage bias of the write transistor is preferred to improve cell retention. Vg_leak_read is related to bitline leakage current. During active read cycle, bitlines are precharged. During standby mode, bitlines may leak to ground, as the bitline states are not maintained, but storage cells are maintained.

Figure 5A:
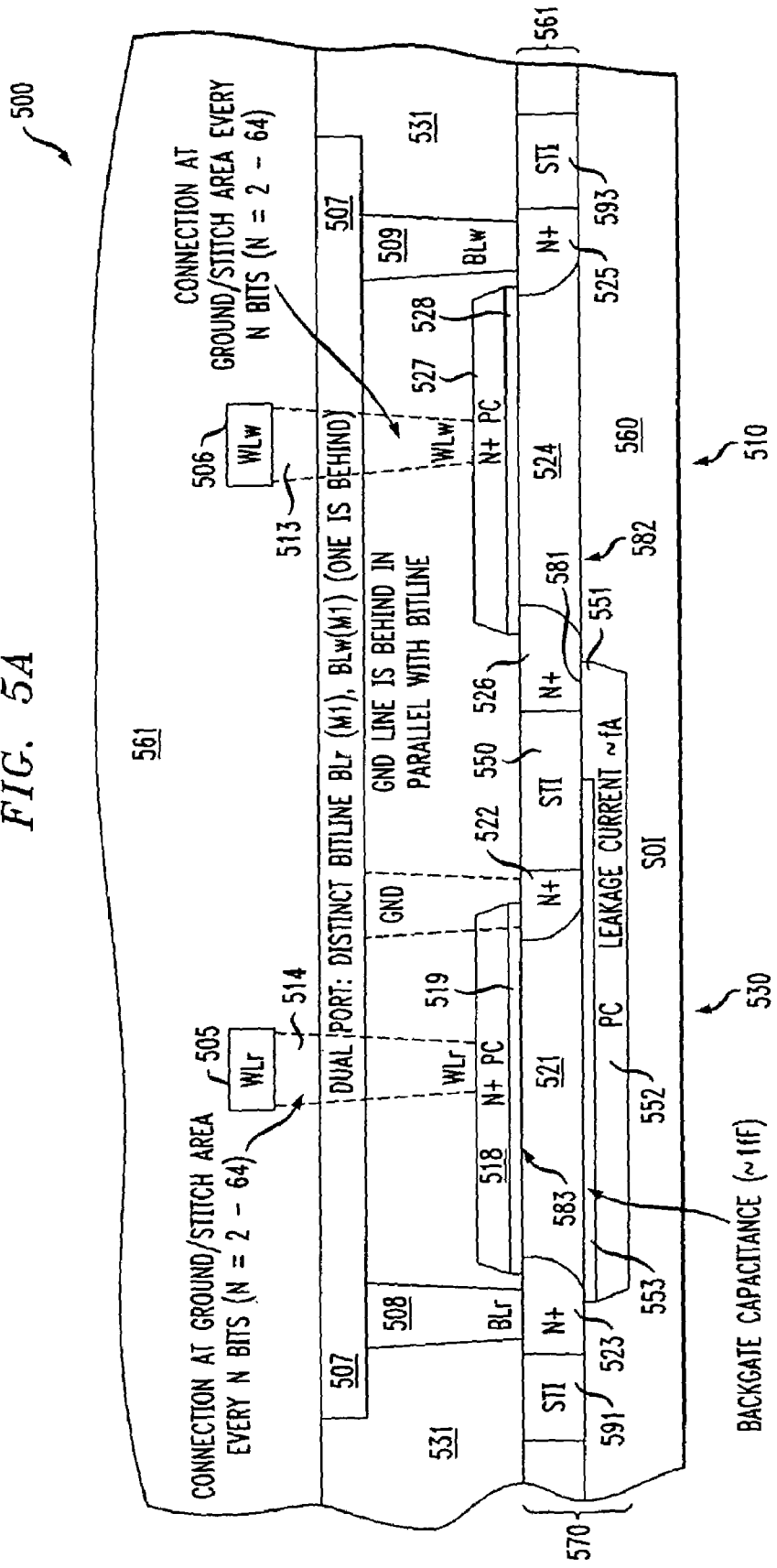
FIG. 5A shows a cross-section of an exemplary memory device having a storage capacitor formed partially from polysilicon and formed on silicon-on-insulator (SOI)
Figure 5B:
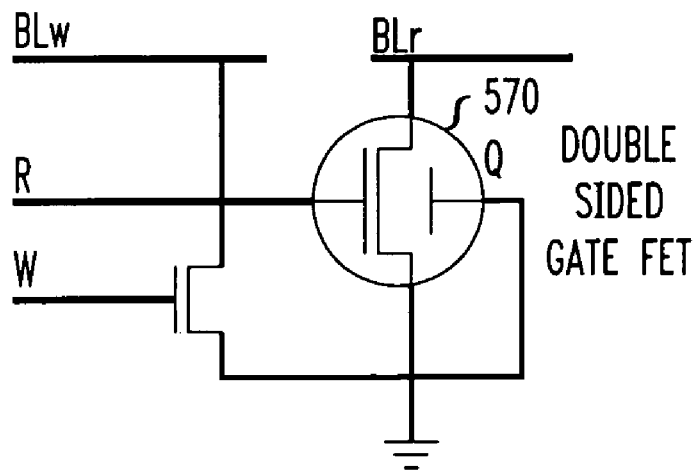
FIGS. 5B and 5C illustrate circuit diagrams that exemplify the circuit of FIG. 5A in dual-port and single-port, respectively, configurations.
Figure 5C:
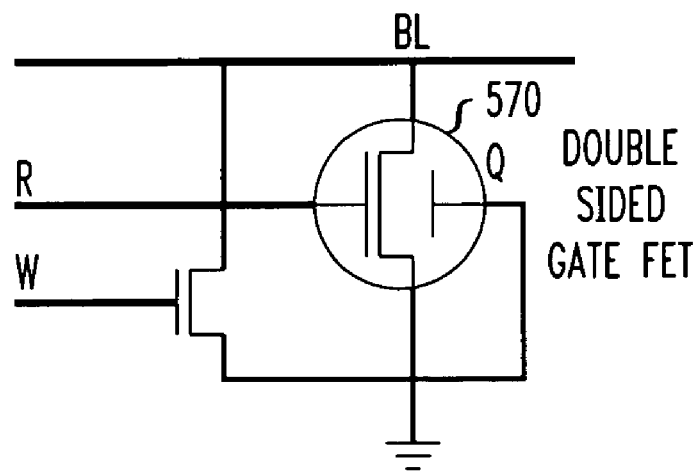

FIG. 5A shows a cross-section of a memory cell structure 500 and FIGS. 5B and 5C show illustrative circuit schematics that can be used to represent the memory cell structure 500. Memory cell structure 500 is another NDR 2T1C memory cell with a charge-storage device at least partially built on the "back side 582" of a silicon-on-insulator (SOI) having a silicon layer 561 and an insulating layer 560. A charge-storage device is formed by polysilicon layer 552, thin oxide 553, and diffusion area 521 (for instance), and the polysilicon layer 552 overlaps the channel region 583. The read transistor 530 includes the diffusion area 521, source/drain regions 522 and 523, gate oxide 519, and p+ doped polysilicon gate 518. The channel region 583 is an area underneath the gate 518 and between the source/drain regions 522 and 523.

A write transistor 510 comprises diffusion area 524, source/drain regions 525 and 526, gate oxide 528, and n+ doped polysilicon gate 527. The write transistor 510 and read transistor 530 are separated by insulator STI 550 and the bottom part 581 of source region 526 is coupled to the polysilicon layer 552 of the charge-storage device through a conductive portion 551, which is generally formed integrally to polysilicon layer 552, or through a coupling contact device on the back side 582 (e.g., of the insulator 561), such as MCBAR and M0 shown earlier in FIGS. 3A, 3B, respectively. The read transistor 530 and write transistor 510 are separated by STI region 550, and the STI regions 591 and 593 separate the read transistor 530 and write transistor 510, respectively, from other devices.

Similar to the previously described structures, the charge-storage device is written via the write transistor 510 from the BL 507 and the charge is then stored in the polysilicon layer 552. The memory cell structure 500 operates differently than the previously described structures. In particular, the stored charge of either zero or one at the back of the read transistor 530 (e.g., the charge stored in polysilicon layer 552) affects the threshold voltage, Vt, of the read transistor 530. The Vt is lower when the charge stored is high (data one), and Vt is higher when the charge stored is zero (data zero). The difference in Vt of the read transistor 530 produces a difference in BL current between reading a zero or one, when the read control line 505 is activated to select a corresponding memory cell. This difference in bitline current may be sensed to determine which value is stored.

The read control line 505 is connected to a selected read transistor 530 through a connection 514, and the write control line 506 is connected to a selected write transistor 510 through the connection 513. The BL 507 is connected to the read transistor 530 through connection 508, and to the write transistor 510 through the connection 509. Read control line 505 and write control line 506 are formed in insulator 561.

Structure 570 includes the read transistor 530 and a charge-storage device, partially formed by polysilicon layer 552. Structure 570 can be diagrammed as circuits, as shown in FIGS. 5B and 5C. FIGS. 5B and 5C show a double sided gate field effect transistor (FET) having a charge, Q. FIG. 5B shows a dual-port memory cell, while FIG. 5C shows a single-port memory cell.

Figure 7:
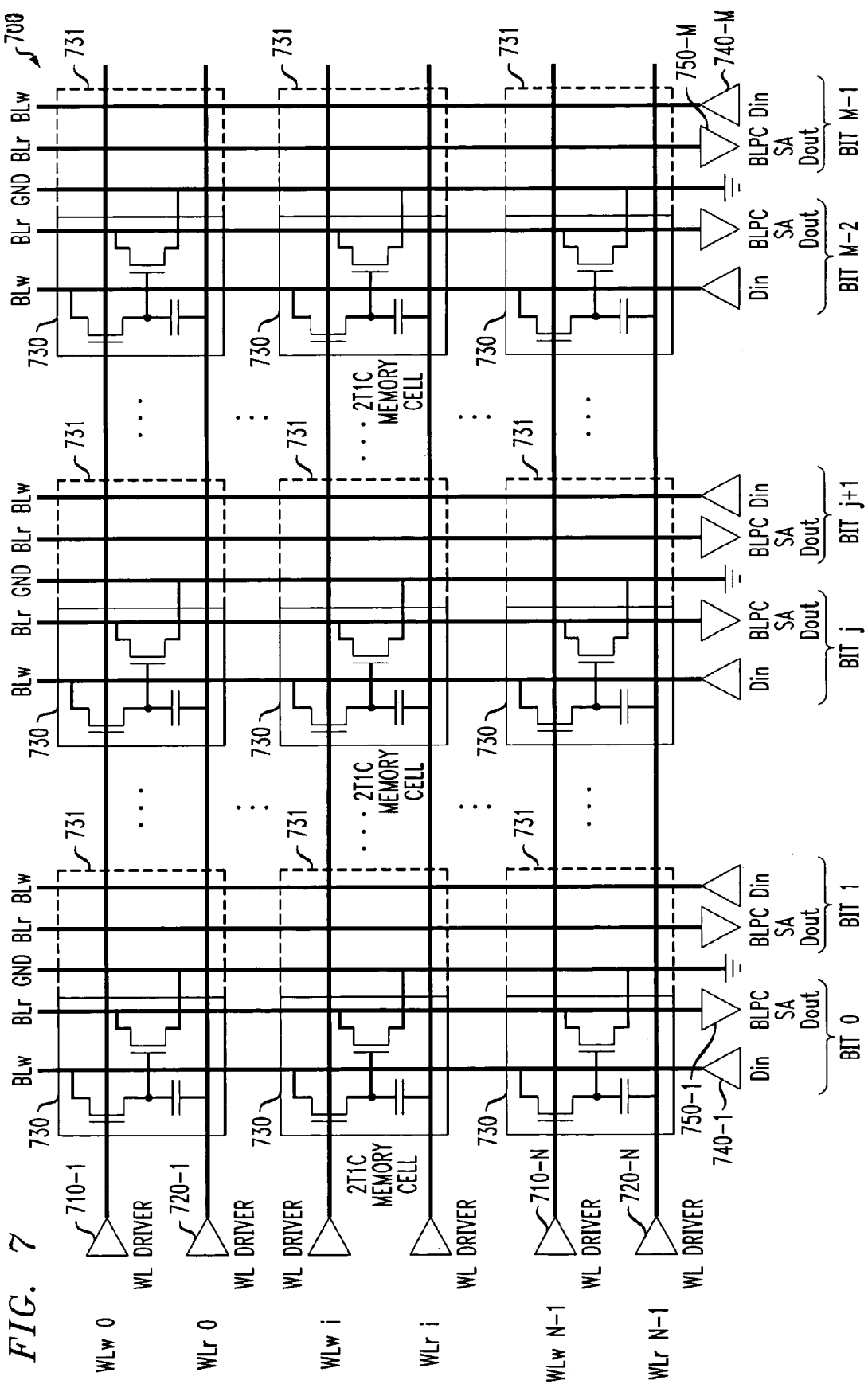
FIG. 7 is an example of a memory array using memory devices of the present invention.

Turning now to FIG. 7, a memory array 700 is shown that uses memory devices of the present invention. Memory array 700 comprises a number of write line drivers 710-1 through 710-N, a number of read line drivers 720-1 through 720-N, a number of 2T1C memory cells 730, a number of 2T1C memory cells 731 that are mirror images of 2T1C memory cells 730, a number of data in drivers 740-1 through 740-M, and a number of data out (e.g., bit line) sense amplifiers 750-1 through 750-M.

It is to be understood that the embodiments and variations shown and described herein are merely illustrative of the principles of this invention and that various modifications may be implemented by those skilled in the art without departing from the scope and spirit of the invention.

What is claimed is:

1. A random access memory (RAM) circuit coupled to a write control line, a read control line, and at least one bitline, the RAM circuit comprising:

a write switch having a control terminal and first and second terminals, the first terminal of the write switch coupled to the at least one bitline, the control terminal of the write switch coupled to the write control line;

a charge-storage device having first and second terminals, wherein the first terminal of the charge-storage device is coupled to the second terminal of the write switch and the second terminal of the charge-storage device is coupled to the read control line; and a read switch having a control terminal and first and second terminals, the control terminal of the read switch coupled to the first terminal of the charge-storage device and coupled to the second terminal of the write switch, the first terminal of the read switch coupled to the at least one bitline, and the second terminal of the read switch coupled to ground.

2. The RAM circuit of claim 1, wherein the charge-storage device is a capacitor.

3. The RAM circuit of claim 1, wherein the at least one bitline comprises a write bitline and a read bitline, the first terminal of the write switch is coupled to the write bitline, and the first terminal of the read switch is coupled to the read bitline.

4. The RAM circuit of claim 1, wherein the write switch is a write transistor, the read switch is a read transistor, the control terminal for each of the write and read transistors is a gate terminal, and the first and second terminals for each of the write and read transistors are source/drain terminals.

5. The RAM circuit of claim 4, wherein the read transistor has a threshold voltage and the threshold voltage, during a read operation when a predetermined voltage is placed on the read control line, is between a cell voltage used to store a first data value and a cell voltage used to store a second data value.

6. The RAM circuit of claim 5, wherein the threshold voltage of the read transistor is between about 0.6 volts and about 1.2 volts.

7. The RAM circuit of claim 5, wherein the first data value corresponds to a zero and the second data value corresponds to a one.

8. The RAM circuit of claim 1, wherein the first terminal of the read switch is coupled to the at least one bitline solely through one or more conductive connections.

9. A method of using a random access memory (RAM) circuit, the RAM circuit coupled to a write control line, a read control line and at least one bitline, the method comprising the steps of:
placing a predetermined bitline voltage on the at least one bitline, the predetermined voltage corresponding to a value to be stored in the RAM circuit;
placing a predetermined write control voltage on the write control line, the write control line coupled to a control terminal of a write switch, the write switch further comprising first and second terminals, the first terminal of the write switch coupled to the at least one bitline, the control terminal of the write switch coupled to the write control line;
placing a predetermined low voltage on the read control line, the read control line coupled to a second terminal of a charge-storage device, the charge-storage device further comprising a first terminal, wherein the first terminal of the charge-storage device is coupled to the second terminal of the write switch; and
placing a predetermined high voltage on the read control line.

10. The method of claim 9, further comprising the step of maintaining the predetermined low voltage for a predetermined time period.

11. The method of claim 10, wherein the predetermined time period ends before the voltage that turns off the write switch is placed on the write control line, whereby there is a stored voltage at the first terminal of the charge storage device.

12. The method of claim 11, wherein the predetermined low voltage is negative and the predetermined high voltage is a ground voltage.

13. The method of claim 11, wherein the predetermine low-voltage is ground voltage and the predetermined high voltage is above ground voltage.

14. The method of claim 11, wherein the predetermined bitline voltage is a voltage corresponding to a data one, wherein the predetermined write control voltage and predetermined bitline voltage are selected so that the write switch is turned off when the predetermined write control voltage is placed on the write control line, the predetermined bitline voltage is placed on the at least one bitline, and the predetermined high voltage is placed on the read control line, whereby the stored voltage may be higher than the predetermined bitline voltage.

15. The method of claim 11, wherein the predetermined bitline voltage is a voltage corresponding to a data zero, wherein the predetermined write control voltage and predetermined bitline voltage are selected so that the write switch is turned on when the predetermined write control voltage is placed on the write control line, the predetermined bitline voltage is placed on the at least one bitline, and the predetermined high voltage is placed on the read control line, whereby the stored voltage may be the same as the predetermined bitline voltage.

16. The method of claim 11, and wherein the first terminal of the charge-storage device is further coupled to a control terminal of a read switch, the read switch further having first and second terminals, the control terminal of the read switch also coupled to the second terminal of the write switch, the first terminal of the read switch coupled to the at least one bitline, and the second terminal of the read switch coupled to ground.

17. The method of claim 16, further comprising the steps of:
placing a second predetermined bitline voltage on the at least one bitline;
placing a read voltage on the read control line, the read voltage selected so that the read switch is turned on;
sensing voltage on the at least one bitline; and
using the sensed voltage to determine a value corresponding to the sensed voltage.

18. The method of claim 17, wherein the second predetermined bitline voltage is between about 0.4 volts to about 1.0 volts.

* * * * *